United States Patent [19]

Matsuda et al.

[11] 4,437,008
[45] Mar. 13, 1984

[54] ELECTRON BEAM CONTROL SYSTEM

[75] Inventors: Tadahito Matsuda, Hohya; Masahide Okumura, Sagamihara; Hisatake Yokouchi, Tokyo; Susumu Ozasa, Kashiwa; Yasuo Kato, Zama, all of Japan

[73] Assignee: Nippon Telegraph & Telephone Public Corporation and Hitachi, Ltd., Tokyo, Japan

[21] Appl. No.: 256,682

[22] Filed: Apr. 23, 1981

[30] Foreign Application Priority Data

Apr. 23, 1980 [JP] Japan ................... 55-52888

[51] Int. Cl.³ .................. H01J 3/14; G06M 3/14
[52] U.S. Cl. .................... 250/396 R; 340/709
[58] Field of Search .......... 250/396 R, 492.2; 340/709; 315/369, 377

[56] References Cited

U.S. PATENT DOCUMENTS

| | | | |
|---|---|---|---|
| 3,729,129 | 4/1973 | Zygielbaum et al. | 340/709 |
| 3,757,117 | 9/1973 | Müller et al. | 250/396 |
| 3,757,120 | 9/1973 | Müller et al. | 250/396 |
| 4,148,014 | 4/1979 | Burson | 340/709 |
| 4,313,227 | 1/1982 | Eder | 340/709 |

*Primary Examiner*—Bruce C. Anderson
*Attorney, Agent, or Firm*—Antonelli, Terry & Wands

[57] ABSTRACT

In an electron beam control system wherein manual adjusting means is used for adjusting currents to flow through two deflection coils which serve to deflect an electron beam in directions of two, x and y axes, respectively; an electron beam control system wherein the manual adjusting means comprises a joy stick type variable resistor which can simultaneously deliver coil deflection signal components in the directions of the two axes through a single operation, and the signal components from the variable resistor are applied to the corresponding deflection coils as adjusting currents.

4 Claims, 3 Drawing Figures

ELECTRON BEAM CONTROL SYSTEM

BACKGROUND OF THE INVENTION

1. Field of the Invention

This invention relates to an electron beam control system for manually controlling an electron beam in an electron-beam lithographic system or the like.

2. Description of the Prior Art

An electron beam control system is adapted to adjust the currents of deflecting coils for deflecting an electron beam in x-axial and y-axial directions. The coil current is produced by, for example, converting a control signal given as a digital quantity into an analog signal by means of a digital-to-analog converter (hereinbelow, abbreviated to "DAC"). The adjustment of the coil current is therefore made by varying the digital input signal of the DAC.

In order to manually vary the digital input signal, the following methods have heretofore been practised:

(1) A set value is varied with digital switches.

This is a method in which the digital switches are disposed for the respective bits of the digital input signal for each deflecting coil, and the respective switches are manually turned "on" and "off", thereby to vary the set value. The controllability of the method is very inferior.

(2) A set value is varied on the basis of the output of a counter which counts the output pulses of an oscillator.

This is a method in which the frequency of the oscillator output pulses to be counted by the counter which has a length corresponding to the number of bits of the digital input signal is coarsely adjusted and finely adjusted, thereby to vary the set value. It requires a coarse adjustment switch as well as a fine adjustment switch for the oscillation frequency and an up/down change-over switch for the counter, in addition to an oscillation starting switch. Further, since the content of the counter vanishes at the turning-off of a power supply, readjustments are necessary when the power supply is closed again. Therefore, the controllability is inferior as in the foregoing method.

SUMMARY OF THE INVENTION

An object of this invention is to solve the problems of the prior art as stated above and to provide a coil current adjusting device of good controllability.

In order to accomplish the object, according to this invention, means such as a variable resistor of the joy stick type adapted to deliver coil current components in x- and y-axial directions through a single manual operation based on the sense of a human being is disposed, and the outputs of the means are applied to corresponding deflection coils so as to simultaneously generate control values of currents of both the deflection coils. Further, according to this invention, the control values are stored in memories in advance, and they are read out and used as may be needed, whereby readjustments at the time when a power supply is closed again are dispensed.

As is well known, the variable resistor of the joy stick type can vary a resistance in a desired direction on a plane through a lever operation. For example, when a lever is moved in the positive direction of the x-axis on the x-y plane, the resistance in the x-axial direction increases, whereas when the lever is moved in the negative direction of the x-axis, the resistance in the x-axial direction decreases.

With the variable resistor having such property, accordingly, a divided voltage output (denoted by $V_x$) of a bias voltage (denoted by $V_{BX}$) in the x-axial direction and a divided voltage output (denoted by $V_y$) of a bias voltage (denoted by $V_{BY}$) in the y-axial direction can be simultaneously and relatively varied by the lever operation.

Since the currents of the x-axial coil and the y-axial coil can be simultaneously and relatively varied by varying the voltages $V_x$ and $V_y$ respectively, it is permitted to visually observe the focused state etc. of an electron beam and to immediately adjust them in interlocking with the lever operation. Therefore, the controllability of the adjustments is sharply enhanced as compared with those of the prior-art methods.

It is also possible to employ a variable resistor of any other type than the joy stick type. For example, there may be employed a variable resistor of the type in which the resistance between two points in a desired direction is varied by irradiating a desired point on an x-y plane with a light beam or the like or by pushing a finger tip or the like against a desired point.

DETAILED DESCRIPTION OF THE PREFERRED EMBODIMENTS

Figure 1:
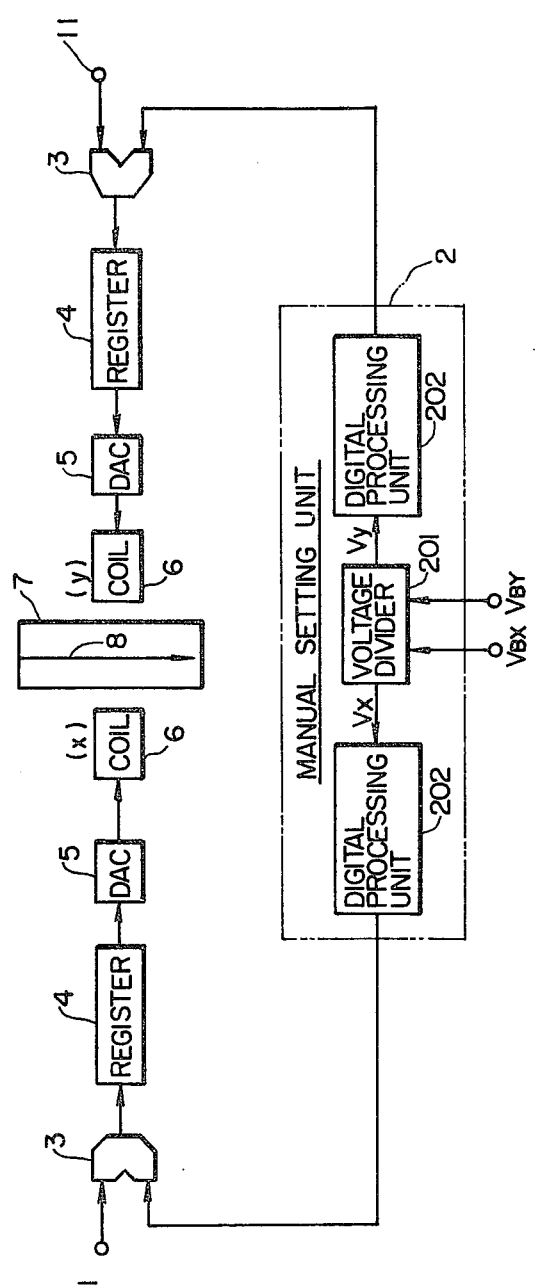
FIG. 1 is a diagram showing the block arrangement of an embodiment of an electron beam control circuit according to this invention.

FIG. 1 shows the block arrangement of a circuit which individually adjusts the focuses etc. of an electron beam in both x-axial and y-axial directions in an electron-beam lithographic system utilizing this invention. By way of example, a case of adjusting the focus etc. in the x-axial direction will be described. The addition between digital data applied to a terminal 1 from a control unit such as computer (not shown) and output data of a manual setting unit 2 according to this invention is executed in an arithmetic unit 3, and the added result is set in a register 4. Thereafter, it is converted by a DAC 5 into an analog value, which becomes an adjusted driving current of a coil 6.

A case of adjusting the focus etc. in the y-axial direction is similar, and digital data applied to a terminal 11 and output data of the manual setting unit 2 according to this invention may be subjected to the same processings as described above.

The manual setting unit 2 in FIG. 1 is constructed of a voltage divider 201 which generates a divided voltage output $V_x$ in the x direction and a divided voltage output $V_y$ in the y direction from a bias voltage $V_{BX}$ in the x direction and a bias voltage $V_{BY}$ in the y direction, respectively, by the use of a variable resistor of the joy stick type, and converting processing units 202 which generate the digital outputs corresponding to the divided voltage outputs $V_x$ and $V_y$.

Figure 2:
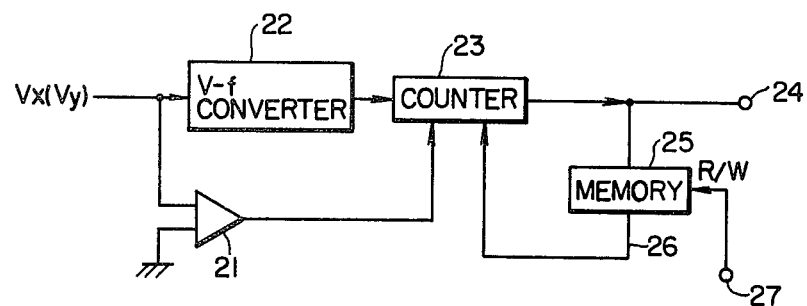
FIG. 2 is a diagram showing the block arrangement of a first embodiment of a digital processing unit in FIG. 1.

FIG. 2 is circuit block diagram showing a first embodiment of the converting processing unit 202.

Referring to FIG. 2, the divided voltage output $V_x$ or $V_y$ of the voltage divider 201 is compared with the earth potential in a comparator 21, and it is simultaneously converted by a voltage (V)-to-frequency (f) converter 22 into a pulse signal of a frequency corresponding to the voltage V, which signal becomes a clock signal of a counter 23. The counter 23 operates in either the countdown mode or the countup mode in response to an output logic level of the comparator 21.

The content of the counter 23 is applied to the arithmetic unit 3 in FIG. 1 through an output terminal 24 as the control value. In this case, if such contents of the counter 23 are stored in a nonvolatile memory 25 in advance, it is only required when a power supply is turned off and then on that the content of a predetermined address of the memory 25 is read out and set into the counter 23, and hence, the operation of a readjustment is dispensed with. Further, even in the presence of a plurality of controlled systems behind the register 4 in FIG. 1, it is possible that individual control values corresponding to the controlled systems are stored in the memory 25 in advance and that any of the control values is read out and used as may be needed. It is also allowed that the content of the counter 23 is once stored in the memory 25, whereupon it is read out and applied to the arithmetic unit 3 through a lead 26.

Figure 3:
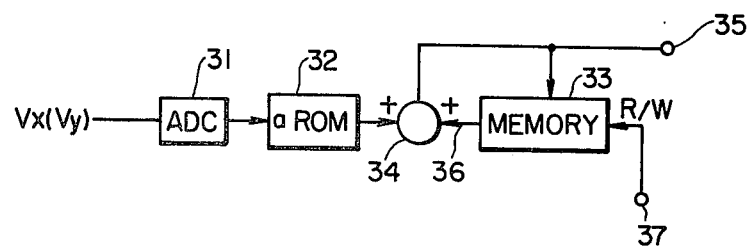
FIG. 3 is a diagram showing the block arrangement of a second embodiment of the digital processing unit in FIG. 1.

FIG. 3 is a circuit block diagram showing a second embodiment of the digital processing unit 202.

Referring to FIG. 3, the voltage $V_x$ or $V_y$ is converted into a digital signal in an analog-to-digital converter (hereinbelow, termed "ADC") 31. Using it as an address, a predetermined control value stored in a ROM 32 and any desired control value stored in a memory 33 are read out. The adding operation between the control values is executed in an adder 34, the output of which is applied to the arithmetic unit 3 in FIG. 1 through an output terminal 35 as the control value described before. Also in this case, when the memory 33 is made a nonvolatile one, the operation of the readjustment in the case of turning off and on the power supply again is dispensed with. The processings in the presence of a plurality of controlled systems behind the register 4 in FIG. 1 are also possible.

It is also allowed that the result of the addition by the adder 34 is once stored in the memory 33, whereupon it is read out and applied to the arithmetic unit 3 through a lead 36.

As the memory 25 in FIG. 2 or the memory 33 in FIG. 3, a buffer register of predetermined bit length or a RAM of predetermined capacity may be employed.

A signal (R/W) for appointing the read/write of the memory is applied from a terminal 27 in FIG. 2 or a terminal 37 in FIG. 3 by turning on/off a switch which is attached to the front end of the lever of the variable resistor.

As set forth above, according to this invention, a lever in a variable resistor of the joy stick type, or the like is operated while visually observing the state of an electron beam, whereby the electron beam can be immediately adjusted. Readjustments after the turning off and on of a power supply are dispensed with by storing the control values of the currents of coils in nonvolatile memories in advance, so that the controllability of adjustments becomes very good. In such manner, the invention is greatly effective.

We claim:

1. An electron beam control system having means for manually adjusting currents flowing through two deflection coils which respectively cause deflection of said beam in directions orthogonal to each other, said means for manually adjusting comprising means to simultaneously produce coil deflection control signals for controlling the current in said two deflection coils by the execution of a single operation, nonvolatile memory means for permitting the selective storage or readout of coil deflection control signals produced by the means to simultaneously produce coil deflection control signals and means for causing the selective application of previously stored coil deflection control signals or currently produced coil deflection control signals to the deflection coils whereby the readjustment of the position of the electron beam may be dispensed with after the control system is turned off and then turned on by the selective application of the stored control signals to the deflection coils.

2. An electron beam control system as defined in claim 1 wherein said manual adjusting means includes a variable resistor of a joy stick type.

3. An electron beam control system as defined in claim 1 wherein said means for manually adjusting comprises first and second circuits for respectively producing the first and second coil deflection control signals, said first and second circuits including a source of variable voltage, a voltage to frequency converter for producing a variable frequency output signal in response to said variable voltage, a countup-countdown counter having an input coupled to the output of the voltage to frequency converter for counting the frequency of the voltage to frequency converter and an output, a comparitor having two inputs and an output, one of said inputs being coupled to said source of variable voltage and the other input being coupled to a source of reference potential and the output being coupled to said counter to control whether the counter operates in either its countup or countdown mode and wherein said output of the counter is coupled to the nonvolatile memory means, the memory means having an output coupled to one of the deflection coils and a read/write control means for selectively controlling the reading of information from said memory or the writing of information within said memory.

4. An electron beam control system in accordance with claim 1 wherein said means for manually adjusting comprises first and second circuits for respectively producing the first and second coil deflection control signals, said first and second circuits including a source of variable voltage, an analog to digital converter having an input coupled to said source of variable voltage and an output, a read only memory having an input coupled to the output of the analog to digital converter for producing an output signal on an output from the memory location represented by the output signal from the analog to digital converter and an output coupled to one of the deflection coils, and wherein the memory means has an input coupled to the ouput of said read only memory and an output coupled to one of the deflection coils and a read/write control means for selectively controlling the reading of information from said memory or the writing of information within said memory.

* * * * *